US012602970B2

(12) United States Patent
Swan et al.

(10) Patent No.: US 12,602,970 B2
(45) Date of Patent: Apr. 14, 2026

(54) PERSONAL SIGNALING DEVICE

(71) Applicant: S&S Precision, LLC, Virginia Beach, VA (US)

(72) Inventors: Johnny E. Swan, Virginia Beach, VA (US); Andrew C. Borland, Virginia Beach, VA (US); William-Joseph B. Elizalde, Virginia Beach, VA (US)

(73) Assignee: S&S Precision, LLC, Virginia Beach, VA (US)

( * ) Notice: Subject to any disclaimer, the term of this patent is extended or adjusted under 35 U.S.C. 154(b) by 21 days.

(21) Appl. No.: 18/416,805

(22) Filed: Jan. 18, 2024

(65) Prior Publication Data

US 2024/0312320 A1     Sep. 19, 2024

Related U.S. Application Data

(60) Provisional application No. 63/439,668, filed on Jan. 18, 2023.

(51) Int. Cl.
*G08B 5/36*          (2006.01)
*F21L 4/04*          (2006.01)
(Continued)

(52) U.S. Cl.
CPC ................. *G08B 5/36* (2013.01); *F21L 4/04* (2013.01); *F21V 15/01* (2013.01); *F21V 19/002* (2013.01); *F21V 19/003* (2013.01); *F21V 19/004* (2013.01); *F21V 21/08* (2013.01); *F21V 21/088* (2013.01); *F21V 23/003* (2013.01); *F21V 23/005* (2013.01); *H05K 5/0017* (2013.01); *H05K 5/0086* (2013.01);
(Continued)

(58) Field of Classification Search
CPC ...... G08B 5/36; H05K 5/0017; H05K 5/0086; H05K 5/0204; H05K 5/06; H05K 5/10; H04B 1/3827; F21L 4/005; F21L 4/04; F21L 4/045; F21V 15/01; F21V 19/0015; F21V 19/002; F21V 19/003; F21V 19/0035; F21V 19/004; F21V 21/08; F21V 21/088; F21V 21/0885; F21V 23/003; F21V 23/005
See application file for complete search history.

(56) References Cited

U.S. PATENT DOCUMENTS

| | | | | |
|---|---|---|---|---|
| 5,001,462 A | * | 3/1991 | Seemann | G08B 5/004 362/253 |
| 7,520,629 B2 | * | 4/2009 | Johnson | F21V 21/0885 362/253 |

(Continued)

OTHER PUBLICATIONS

International Search Report, PCT/US24/12071, Jun. 26, 2024.
Written Opinion of the International Searching Authority, PCT/US24/12071, Jun. 26, 2024.

*Primary Examiner* — John A Tweel, Jr.
(74) *Attorney, Agent, or Firm* — Tanner IP, PLLC

(57) ABSTRACT

A personal signaling device including an electronics package with a circuit board, an emitter, and an activation switch. The device may include a translucent body with a lens section, an extended seal, and/or an attachment through hole. The device may include a base with an inner well configured to at least partially enclose the electronics package, an outer well configured to at least partially surround the sealing ring, and an attachment through hole configured to join with that of the translucent body.

10 Claims, 7 Drawing Sheets

(51) Int. Cl.

| | | |
|---|---|---|
| *F21V 15/01* | (2006.01) | |
| *F21V 19/00* | (2006.01) | |
| *F21V 21/08* | (2006.01) | |
| *F21V 21/088* | (2006.01) | |
| *F21V 23/00* | (2015.01) | |
| *H05K 5/00* | (2006.01) | |
| *H05K 5/02* | (2006.01) | |
| *H05K 5/06* | (2006.01) | |
| *H05K 5/10* | (2025.01) | |

(52) U.S. Cl.
CPC ............. *H05K 5/0204* (2013.01); *H05K 5/06* (2013.01); *H05K 5/10* (2025.01)

(56) References Cited

U.S. PATENT DOCUMENTS

| | | | | |
|---|---|---|---|---|
| 8,491,148 | B2* | 7/2013 | Coushaine .............. | F21V 31/00 362/267 |
| 11,698,184 | B2* | 7/2023 | Ormsbee .............. | F21V 23/004 362/191 |
| 2002/0135999 | A1* | 9/2002 | Chen .................... | F21V 27/005 362/208 |
| 2007/0171082 | A1* | 7/2007 | Melnik ................... | F21L 4/005 340/574 |
| 2007/0200716 | A1* | 8/2007 | Haase ................ | G08B 21/0202 340/574 |
| 2010/0128470 | A1 | 5/2010 | Swan et al. | |
| 2013/0176714 | A1 | 7/2013 | Leegate et al. | |
| 2019/0137093 | A1 | 5/2019 | Matte et al. | |

* cited by examiner

PERSONAL SIGNALING DEVICE

BACKGROUND OF THE INVENTION

In recent years, the use of small personal illumination and/or signaling devices has become widespread first in military and law enforcement units, and spreading throughout the first responder, emergency response, and civilian markets. Traditionally, such marking was achieved by disposable chemical illumination markers (i.e. "chem lights"), strips of illuminating and/or reflective materials, or bulky strobe lights. Military units, law enforcement agencies, civil services, and civilians now use such strobes and other lights for various purposes such as to identify themselves or injured personnel, hazardous areas, and other objects or places of interest. Depending on the circumstances, or nature of the thing being marked, different lighting functions may be used for such purposes, such as different light spectrums, colors, and/or intensities.

Known personal illumination and/or signaling devices suffer from a number of limitations related to their specific designs, such as reusability (which is not possible with chemical lights), battery replacement (which may be difficult and/or require tools), and adequate sealing of such devices in harsh environments (such as frequent transitions between extreme temperatures and between salt water and air).

BRIEF SUMMARY OF THE INVENTION

According to aspects of the disclosure, embodiments generally include a personal signaling device including an electronics package with a circuit board, an emitter, and an activation switch. The device may include a translucent body with a lens section, an extended seal, and/or an attachment through hole. The device may include a base with an inner well configured to at least partially enclose the electronics package, an outer well configured to at least partially surround the sealing ring, and an attachment through hole configured to join with that of the translucent body.

In embodiments, the translucent body and the base may be configured to be joined and un-joined by a user via a friction fit between the translucent body and the base. In the joined configuration the electronics package may be sealed between the translucent body and the base. The seal formed between the translucent body and the base may be a watertight seal rated at IP67, IP 68, ISO 2281, 1 atm, or 3 atm.

In embodiments, the translucent body and the base may be configured to seal the electronics package via a double seal at least partially between an inner surface of the sealing ring and the inner well, and an outer surface of the sealing ring and the outer well.

In embodiments, the marking device may be capable of activation, deactivation, and subsequent reactivation by manipulation of the activation switch.

In embodiments, a tactile feedback mechanism, such as a vibrating motor, may be electrically connected to the circuit board.

In embodiments, manipulation of activation switch may activate or deactivate the tactile feedback mechanism to indicate activation or deactivation of the emitter.

In embodiments, a transceiver, such as an NF transceiver, may be electrically connected to the circuit board and may be configured to change at least one of a programming, blink pattern, emitting spectrum, or status of the personal signaling device.

In embodiments, the base may be opaque and the lens section may include all, or substantially all, of the body that is not obstructed from outward view by the base.

In embodiments, the emitter may include one or more LEDs.

In embodiments, the extended seal may include a plurality of ribs and the outer well may be integrally formed with a plurality of seal channels extending outward from the inner well, and the plurality of ribs may be configured to join with the plurality of seal channels.

In embodiments, the attachment through hole of the translucent body may be configured to seal at least partially around the attachment through hole of the base.

In embodiments, a battery may be in electrical connection to the circuit board, and the battery may be surrounded by the inner well.

In embodiments, a mounting clip may be configured to attach to the body and the base. The mounting clip may include a first attachment plug and a second attachment plug, the first attachment plug and the second attachment plug being connected by a flexible tab, and the first attachment plug and the second attachment plug configured to connect to one another through the attachment through hole of the translucent body and the attachment through hole of the base.

In embodiments, the body and/or base may be ergonomically designed with a substantially or entirely convex outer surface, e.g. to avoid snag hazards or otherwise adapt the signaling device for use during tactical or rescue operations.

Signaling and/or lighting devices may be provided including a plurality of emitters, and an activation switch to change an active emitter. For example, a signaling device may include a non-visible light emitter, a visible light emitter, an inaudible sound emitter, and/or an audible sound emitter, and an activation switch that activates the device and/or switches between active emitters. In embodiments, the device may be configured to activate a particular emitter when initially turned on, such as activating the non-visible light emitter. Although exemplary embodiments may be described for convenience and ease of description in the context of, for example, visible and non-visible light emitters, the invention is not necessarily limited to such embodiments and may include emitters and signaling devices of various sorts.

Embodiments may include, for example, a multi-spectrum lighting device including at least one light source. The at least one light source may be configured to emit light in at least a first spectrum and a second spectrum. The first spectrum may be a non-visible spectrum and the second spectrum may be a visible spectrum. Embodiments may include any number of light sources, in any spectrums, including non-visible spectrums and visible spectrums.

Embodiments may include an activation switch configured to turn the device on, turn the device off, switch an emitting mode of the device, and/or combinations thereof.

In embodiments, the activation switch, or switching mechanism, may be configured with a switch located on a circuit board under a rigid well, e.g. of the base, such that the switch cannot be depressed when the device is pushed against a flat surface of a predetermined size, e.g. the activation switch is not responsive when pushed on by an object with a surface profile that is substantially larger than a human finger, larger than a flat surface with a diameter approximately 1.0 inch or greater, contact surfaces larger than 1.0 square inch, etc. As used herein, when describing force applying objects and surfaces, "contact surfaces" should be understood as those surfaces that exert a force vector with a component in the direction of switch activation when the object is pressed to the switch and/or against the device. For example, in the case of a generally cylindrical force-applying member with a rounded tip, like a human finger, the surfaces of the rounded tip would be considered to be contact surfaces as they exert a force vector with a component in the direction of switch activation when the finger is pressed against the switch in the direction of the switch actuation. On the contrary, the cylinder walls, e.g. the sides of the finger, would generally not be considered to be contact surfaces.

According to embodiments, the device may be configured to emit light only in the first spectrum when initially turned on, and to change the emitted light to the second spectrum in response to further manipulation of the activation switch.

According to embodiments, the emitter may include at least one light source such as an LED. In embodiments, an emitted light may be emitted at least partially through the body. The base may be configured to mount the device on, and to at least partially conform to, a curved mounting surface. In embodiments, the body may include a substantially curved emitting surface that extends upwards from the base, and/or extends substantially, or exclusively, inward of the base in plan view. Substantially all of the emitting surface above the base may be configured to allow the emitted light to pass therethrough.

In embodiments, the tactile feedback mechanism may be configured to provide a tactile feedback for at least one of when the device is turned on, when the device is turned off, when a spectrum of emitted light is changed, and or an emitting pattern is changed. In embodiments, the feedback mechanism may be configured to provide a first tactile feedback when the device is activated to emit light in the first spectrum and a second tactile feedback, different than the first tactile feedback, when the device is activated to emit light in the second spectrum. In embodiments, the feedback mechanism may be configured to provide tactile feedback while the device is emitting. Any number of different patterns and/or forms of tactile feedback are possible depending on, for example, the number of different emission types, intensities, patterns, etc. Alternatively, embodiments may include tactile feedback for certain emissions, and no tactile feedback for others. For example, an initial, intermittent or sustained tactile feedback may be provided when non-visible, or other emissions that are not discernable by humans without specialized equipment, are activated and/or are being emitted, to alert the user that the device is on. In embodiments, the device may be configured to activate the tactile feedback mechanism when any manner of remote programming is accepted, e.g. changing an emitting pattern via NF communication.

In embodiments, the feedback mechanism may include a motor attached to the circuit board that provides the tactile feedback, such as by rotating an offset wheel or other vibration causing mechanism. In embodiments, the motor may be actuated at different rotating speeds or patterns for different active emitters. In embodiments, the device may be configured such that the tactile feedback can be felt through the body and/or base.

According to other aspects of the disclosure, the emitter may be contained in the body, and the body may include a switch portion through which manipulation of the activation switch may be achieved, e.g. via depression of the flexible body. Emitted light may be emitted at least partially, or substantially, through the body. In embodiments, approximately 75%, or more, of the body's outer surface may be configured as an emitting surface.

In embodiments, the emitter may include a plurality of light sources configured to emit light in different spectrums. In embodiments, the at least one light source may include at least one of a visible light emitter, a non-visible light emitter, a visible laser emitter, a non-visible laser emitter and combinations thereof. According to embodiments, the light emitting diode(s) may be completely encapsulated within the body. In embodiments, the emitter may include a light emitting diode and associated controls capable of programming to allow illumination of the lighting device in different colors, e.g by manipulation of the activation switch and or via a transceiver.

In embodiments, the body, and/or base, may include one or more apertures disposed through the body/base to attach the device to a mounting surface. The body and/or base may include one or more clipping mechanisms, e.g. disposed on the body, and/or base, to attach the device to a mounting surface.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention claimed. The detailed description and the specific examples, however, indicate only preferred embodiments of the invention. Various changes and modifications within the spirit and scope of the invention will become apparent to those skilled in the art from this detailed description.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the related technology. No attempt is made to show structural details of technology in more detail than may be necessary for a fundamental understanding of the invention and various ways in which it may be practiced. In the drawings.

DETAILED DESCRIPTION OF THE INVENTION

Figure 1:
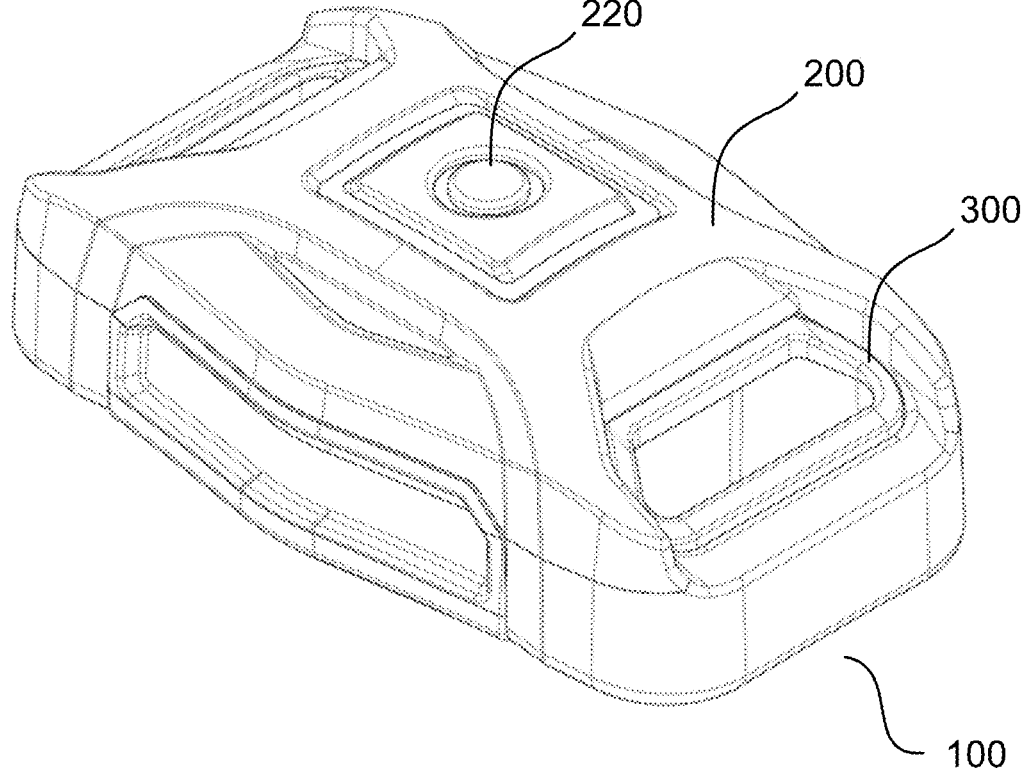
FIG. 1 is a perspective view of a first embodiment of an exemplary personal signaling device according to aspects of the invention.

It is understood that the invention is not limited to the particular methodology, protocols, etc., described herein, as these may vary as the skilled artisan will recognize. It is also to be understood that the terminology used herein is used for the purpose of describing particular embodiments only, and is not intended to limit the scope of the invention. It also is to be noted that as used herein and in the appended claims, the singular forms "a," "an," and "the" include the plural reference unless the context clearly dictates otherwise. Thus, for example, a reference to "a through hole" is a reference to one or more through holes and equivalents thereof known to those skilled in the art.

Unless defined otherwise, all technical terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law.

Moreover, provided immediately below is a "Definition" section, where certain terms related to the invention are defined specifically. Particular components, devices, and materials are described, although any components and materials similar or equivalent to those described herein can be used in the practice or testing of the invention. All references referred to herein are incorporated by reference herein in their entirety.

The term "substantially" as used herein should be understood as 90% or greater, unless otherwise specified. For example, if a structural feature is "made substantially of plastic," that should be understood as "made 90% or greater of plastic," or if the surface of a structural feature is "substantially convex" it is convex across 90% or greater of its surface.

The term "visible spectrum" as used herein refers to electromagnetic radiation of a spectrum that is discernable by the human eye, and may include ranges around 400-790 THz. The term "non-visible spectrum" as used herein refers to electromagnetic radiation of a spectrum that is not discernable by the human eye, including, for example, short wave infrared (SWIR), the near infrared (NIR) the Medium Wavelength IR (MWIR), Long Wavelength or Far Infrared (LWIR or FIR), or ultraviolet spectrums, as well as other electromagnetic spectrums that may be used as illumination for specialized detectors and the like.

The term "lighting source" as used herein may refer to various types of emitters, including those that emit light, and other detectable waves, in visible and non-visible spectrums. Lighting sources may include, for example, all manner of electrically powered, chemical, and organic sources of various detectable radiation.

The term "watertight seal" as used herein generally refers to a watertight seal rated at IP67, or, if specified, IP 68, ISO 2281, or specific atmospheres, e.g. 1 atm, 3 atm, etc.

The following preferred embodiments may be described in the context of exemplary lighting devices for ease of description and understanding. However, the invention is not limited to the specifically described devices and methods, and may be adapted to various apparatus without departing from the overall scope of the invention.

Embodiments provide a personal signaling device that may be substantially sealed within a translucent silicon rubber body (although other similar materials for the body are within the scope of embodiments, as described below) and a base (which may be manufactured from a more rigid and/or opaque material). The body and the base may be configured to be joined and un-joined by a user without tools, while still maintaining a seal when joined. This process of manufacturing may provide an extremely rugged and versatile waterproof housing that allows for easy battery changes. The body has a shape and texture that provides a medium for the light waves to be refracted through and along its longitudinal axis, which may illuminate the body entirely or substantially (or where not obstructed by an opaque base).

The signaling device of various embodiments is well-suited for military and law enforcement units or for emergency/safety marking in outdoor recreational activities. In embodiments, the signaling device utilizes its ergonomic design and multiple attachment methods to make it both versatile and user-friendly.

A benefit of the signaling device is that it gives the end user the control of being able to activate or deactivate (and reactivate) the illumination source when desired. This can be, for example, a steady state illumination, one or more flashing sequences, one or more frequency shifting patterns, or combinations thereof. The signaling device may be used multiple times and may perform more than one color or light sequence operation.

As shown in FIG. 1, a signaling device 100 may have a body 200 overlaying a base 300. In embodiments, the body 200 may be formed from an elastic, translucent material, allowing it to form a seal with a rigid base 300, and diffusing light throughout the body 200. As such, substantially all of the outer surface of the body 200 may be an emitting surface when the signaling device 100 is activated, apart from any portions that are obstructed from view by the opaque base 300. In this regard, the portion of the body 200 that joins with and forms the emitting surface may be further configured and understood as a "lens" by which light is directed from the emitter(s) of the circuit board to the emitting surface.

As also shown in FIG. 1, the body 200 a signaling device 100 may have a "button" 220 portion that is molded or otherwise configured to interact with an underlying pressure switch, discussed further herein.

The body 200 may be transparent and/or translucent, and made of, for example, flexible silicone and/or other similar materials. The base 300 may be configured to conform to an ergonomically-designed shape, e.g. that fits on top of a helmet's curved portion or in the end user's equipment. Additionally, the same signaling device 100 is capable of multiple uses and is versatile, as the signaling device is sized and shaped to fit within the slots of Modular Lightweight Load bearing Equipment ("MOLLE") found on most modern tactical load bearing equipment. During ground operations, the signaling device 100 is also capable of functioning as a marking device.

Figure 2:
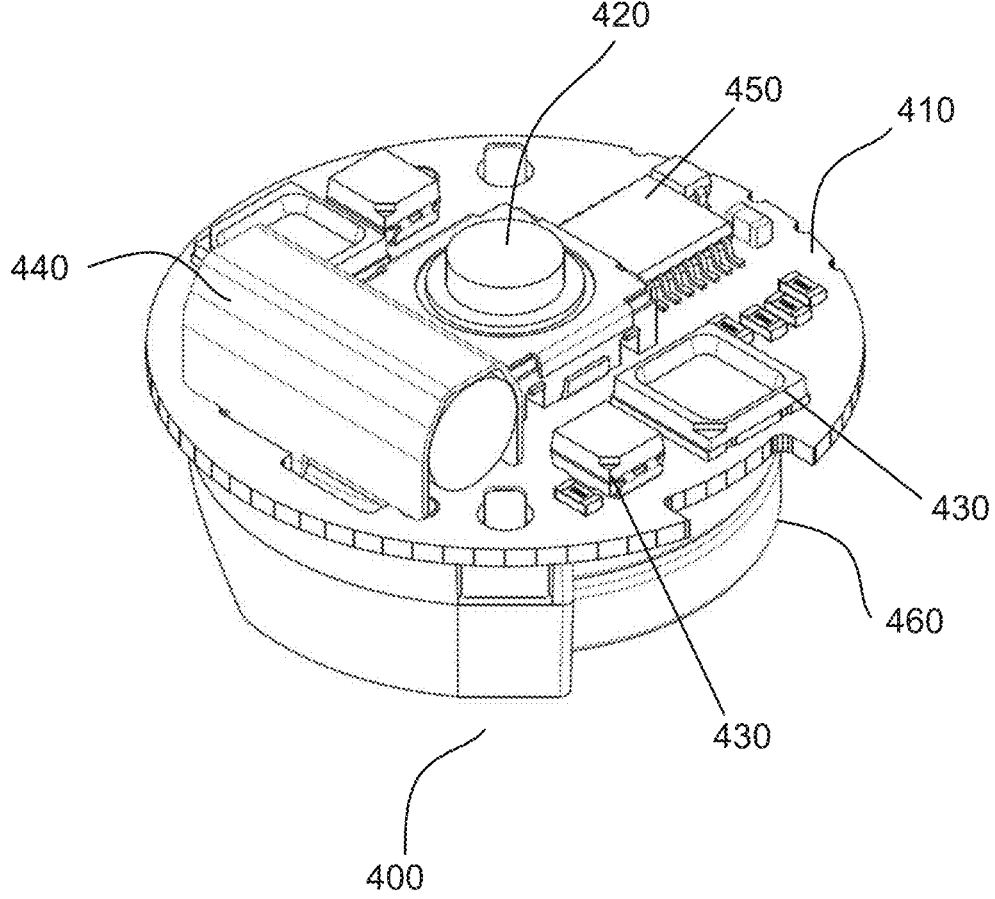
FIG. 2 is a perspective view of an exemplary electronics package according to aspects of the invention.

FIG. 2 is a perspective view of an exemplary electronics package 400 according to aspects of the invention. As shown in FIG. 2, an electronics package 400 may include a circuit board 410, an activation switch 420 and LEDs. The activation switch 420 and LEDs are electrically connected via the circuit board 410 and embedded memory and/or logic.

The lighting sequence(s) of the device 100 are controlled by a microcontroller or microprocessor which is operatively attached to the circuit board 410. The microcontroller or microprocessor is the brain of the electronic components and device 100, and works on hardware, software, and/or logic circuits as known in the art. The microcontroller or microprocessor controls, for example, LED blink patterns and rate, LED color/frequency patterns, timed shut down sequences, and a variety of other user-specific functions.

The activation switch 420 and associated logic may be configured to simply turn the device 100 on and off, or may be further configured in myriad ways described herein. For example, activation switch 420 and associated logic may be configured to change an active emitter amongst the LEDs. This may include a non-visible light emitter, a visible light emitter, an inaudible sound emitter, and/or an audible sound emitter. In embodiments, the device 100 may be configured to activate a particular emitter when initially turned on, such as activating the non-visible light emitter. Although exemplary embodiments may be described for convenience and ease of description in the context of, for example, visible and non-visible light emitters, the device 100 is not necessarily limited to such embodiments and may include emitters and signaling devices of various sorts.

One or more of the LEDs may be configured to emit light in a first spectrum and a second spectrum, i.e. providing a "multi-spectrum" emitter. The first spectrum may be a non-visible spectrum and the second spectrum may be a visible spectrum. This may extend to any number of light sources, in any spectrums, including non-visible spectrums and visible spectrums.

LEDs may include a plurality of light sources configured to emit light in different spectrums. For example, LEDs may include one or more visible light emitters, one or more non-visible light emitters, one or more visible laser emitters, one or more non-visible laser emitters and combinations thereof. These, and other multi-mode emitters known in the art, may allow device 100 the capability of illuminating the device in different colors, e.g by manipulation of the activation switch and or via a transceiver 450.

Manipulation of activation switch 420 may also activate or deactivate the tactile feedback mechanism 440 to indicate activation or deactivation of the LEDs 430.

The tactile feedback mechanism 440 may be configured to provide a tactile feedback for at least one of when the device is turned on, when the device is turned off, when a spectrum of emitted light is changed, and or an emitting pattern is changed. In embodiments, the feedback mechanism 440 may be configured to provide a first tactile feedback when the device 100 is activated to emit light in the first spectrum and a second tactile feedback, different than the first tactile feedback, when the device 100 is activated to emit light in the second spectrum.

In embodiments, the feedback mechanism 440 may be configured to provide tactile feedback while the device 100 is emitting. Any number of different patterns and/or forms of tactile feedback are possible depending on, for example, the number of different emission types, intensities, patterns, etc. Alternatively, embodiments may include tactile feedback for certain emissions, and no tactile feedback for others. For example, an initial, intermittent or sustained tactile feedback may be provided when non-visible, or other emissions that are not discernable by humans without specialized equipment, are activated and/or are being emitted, to alert the user that the device is on. In embodiments, the device 100 may be configured to activate the tactile feedback mechanism

440 when any manner of remote programming is accepted, e.g. changing an emitting pattern via NF communication with transceiver 450.

In embodiments, the feedback mechanism 440 may include a motor attached to the circuit board 410 that provides the tactile feedback, such as by rotating an offset wheel or other vibration causing mechanism. In embodiments, the motor may be actuated at different rotating speeds for different active LEDs 430. In embodiments, the device 100 may be configured such that the tactile feedback can be felt through the body 200 and/or base 300.

A transceiver 450, such as an NF transceiver, may be electrically connected to the circuit board 410 and may be configured to change at least one of a programming, blink pattern, emitting spectrum, or status of the personal signaling device via memory or logic included in the circuit board 410. For example, remotely programing a blink pattern and/or frequency change may be beneficial in specifically identifying an individual or unit association, such that they can be specifically identified via the naked eye (e.g. slow blink or color patterns), or by automated systems capable of discerning minute changes in blink and/or frequency pattern changes.

As also shown in FIG. 2, one or more batteries 460 are electrically connected to the circuit board 410, and (as discussed further below) the batteries 460 may be surrounded by the inner well of the base 300.

In embodiments, to further reduce the possibility of activating the device in the visible light spectrum, or other overt emission spectrums, the device 100 may be configured to only turn on in the non-visible light spectrum, or other covert emission spectrum, when initially powered on, regardless of the activation of switch 420 and the like. Switch 420 and more generally EP 400 may be configured to switch the device 100 on and off, as well as change emitted colors/spectrums, intensity, and/or blink patterns.

As shown in FIG. 2, a plurality of emitters may be electrically connected to the circuit board 410. Emitters may include one or more single-color LEDs, one or more multi-color LEDs, one or more non-visible LEDs, and/or various types of other emitters including, for example, sound or radio emitters including encrypted and/or unencrypted signals.

The emitters may be programmed to, for example, illuminate in multiple visible colors (e.g., four colors) with one or more LEDs within one device 100. A particular color of the multiple colors may be selected by activating the switch 420, giving the user the capability of activating multiple illumination colors with one device.

In embodiments, emitters may include a first spectrum emitter, e.g. FIR emitters, other emitter(s) may be second spectrum emitters, e.g. one or more visible color emitters, and other emitter(s) may be a third spectrum emitter, e.g. an SWIR emitter. Thus, devices according to aspects of the invention may operate in various spectrums including one or more spectrums in the non-visible spectrums. This may be advantageous, for example, in providing even more difficult to distinguish emissions for clandestine operations, such as near infrared (NIR) to the shortwave infrared (SWIR) portions of the light spectrum, which are beyond what traditional night vision goggles can see. The tactile feedback features described herein may be particularly useful in such cases where individual users may not have the capability to see the emitted spectrum, which may be seen by air platforms or other specialized receivers. In some cases NIR/SWIR cameras may be configured to see light wavelengths from 0.7 micrometers (.mu.m) to 1.7 .mu.m, whereas traditional NVDs can detect wavelengths up to roughly 1.0 .mu.m. Although described in the context of visible and non-visible light emitters, such as LEDs, it should be understood that various types of other emitters are contemplated as within the scope of the invention, including various sound and radio emitters, which may also include encrypted and unencrypted transmissions, etc. Likewise, although different emitters are described for different wavelength, multimode emitters may also be used and switched between, according to desired configurations of the device. For example, military devices may include a combination of visible and non-visible emitters, whereas commercial or rescue devices may include a combination of visible colors, intensity settings, etc. Such features can be pre-programmed or modified using transceiver programming capabilities of the device 100.

Figure 3:
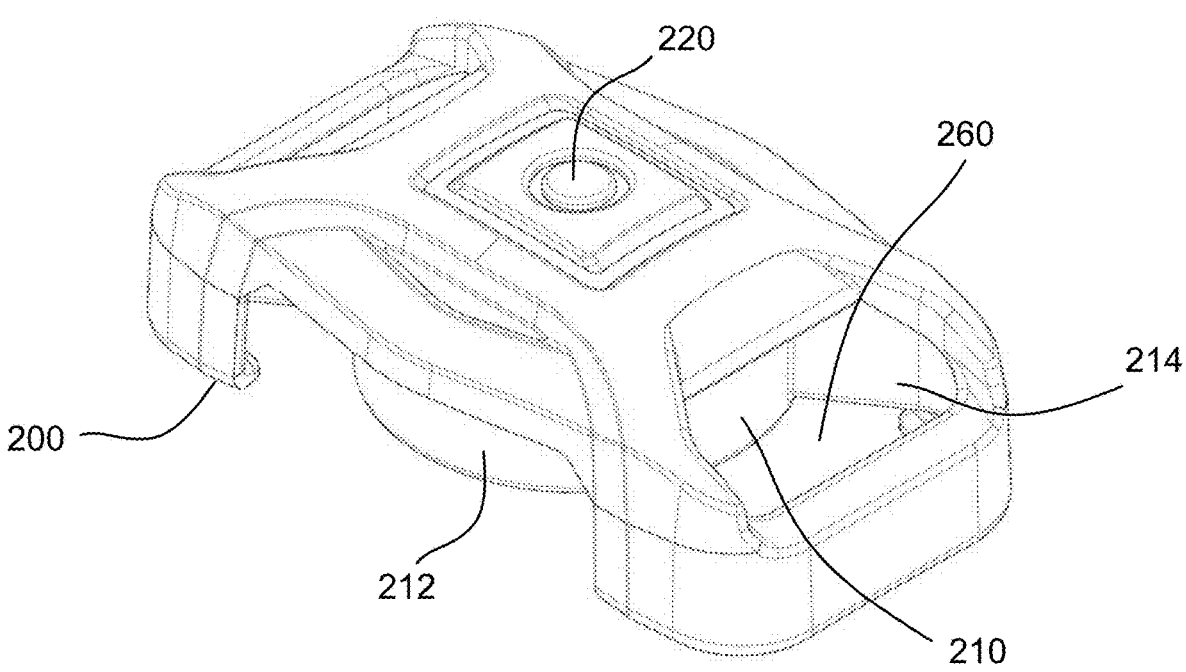
FIG. 3 is a perspective view of an exemplary translucent body according to aspects of the invention.

FIG. 3 is a perspective view of an exemplary translucent body 200 according to aspects of the invention. As shown in FIG. 3, the translucent body 200 includes a seal 210, a button area 220, and attachment though holes 260. The seal 210 may include both a substantially annular joining ring 212 and a plurality of joining ribs 214. The button area 220 may be configured to promote interaction with the underlying activation switch 420 shown in FIG. 2, e.g. by providing a tactile indication of where the underlying activation switch 420 is, by including an underlying protrusion, and/or being formed to flex in a way that allows manipulation of the underlying activation switch 420.

In embodiments, the body 200 may be configured to be partially, substantially, or completely translucent, thereby the body of the device 100 to act as a medium for the different light spectrums to pass through. Therefore, in embodiments where, for example, substantially all of the body 200 is configured to be translucent, the device 100 may provide illumination from the majority of the body's outer surface. In embodiments, emitters in the device 100 may be located, oriented, or otherwise configured, to direct light to the body 200, e.g. by orienting the emitters to project light upward in the device 100. In embodiments, the base 300 may be opaque and may be configured to direct light from the emitters toward the body, e.g. to enhance illumination around substantially the whole outer surface of device 100.

Figure 4:
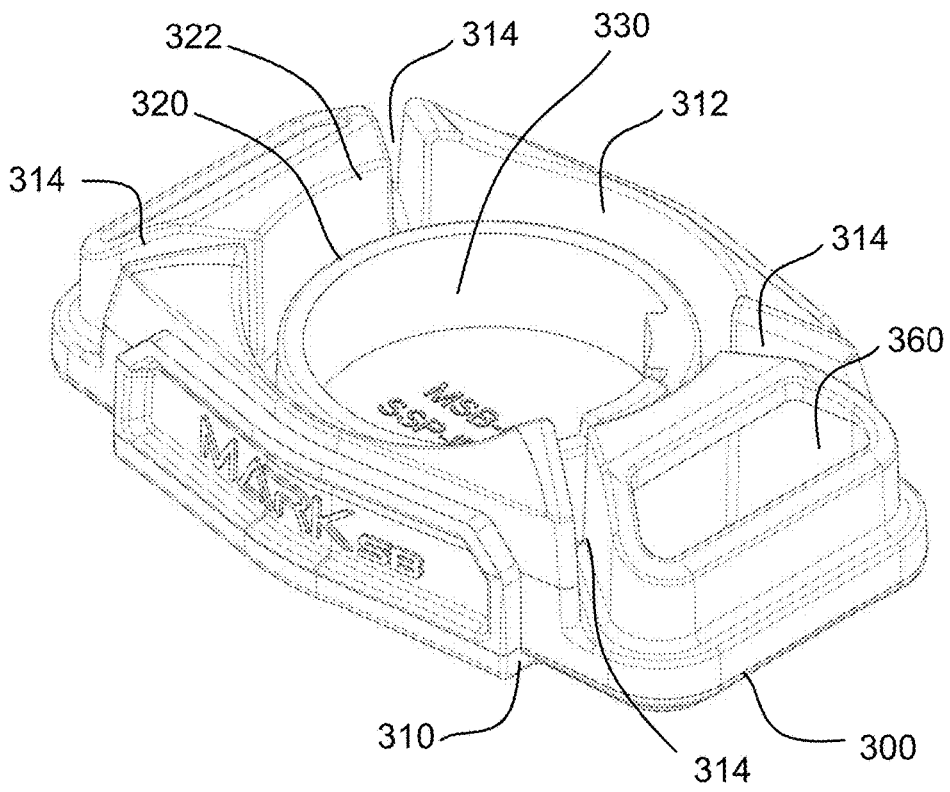
FIG. 4 is a perspective view of an exemplary base according to aspects of the invention.

As also shown in FIG. 3, attachment through holes 260 may be provided that are configured to mate with corresponding attachment through holes 360 of the base 300, shown in FIG. 4.

FIG. 4 is a perspective view of an exemplary base 300 according to aspects of the invention. The base 300 may be made from a material that is more rigid than body 200. For example the base 300 may be molded from a plastic material, or other relatively rigid material, thereby providing a form with which body 200 may be forced into engagement with. Base 300 may be formed of an opaque, translucent, or transparent material. As shown in FIG. 4, the base 300 includes a baseplate 310, a seal well 312, and a plurality of seal channels 314. The seal well 312 is defined by an inner ring 320, and an outer ring 322. The seal well 312 is configured to accommodate the joining ring 212 of the body, and the seal channels 314 are configured to accommodate the joining ribs 214. Inside of the inner ring 320 is an electronics package (EP) well 330 configured to at least partially secure and/or surround the electronics package 400, including the batteries 460.

As also shown in FIG. 4, the upper surface of the inner ring 320 may sit below the upper surface of the surrounding base 300, e.g. to shield the activation switch 420 from blunt contact when the electronics package 400 is seated in the base 300. This can prevent the activation switch 420 from being depressed when the device 100 is pushed against a flat surface of a predetermined size, e.g. the activation switch 420 is not responsive when pushed on by an object with a surface profile that is substantially larger than a human finger, larger than a flat surface with a diameter approximately 1.0 inch or greater, contact surfaces larger than 1.0 square inch, etc.

Base 300 may include attachment through holes 360 that provide several functions, including joining the body 200 to the base 300, and securing the device 100 to a clip or other form of equipment. The attachment through holes 260 of the translucent body may be configured to seal at least partially around the attachment through holes 360 of the base.

Thus, as will be appreciated considering the foregoing figures in combination, it should be understood that the device 100 may include a translucent body 200 that may be joined and un-joined with the relatively rigid base 300 by a user via a friction fit between the translucent body 200 and the base 300. In the joined configuration the electronics package 400 may be sealed between the translucent body 200 and the base 300.

Using this robust sealing mechanism, including both the (male) ring and ribs of the body 200 joined with the (female) seal well 312 and channels 314 of the base 300, the device is capable of sealing the electronics package 400 via a double seal at least partially between an inner surface of the joining ring 212 and the inner ring 320, and an outer surface of the joining ring 212 and the outer ring 322, as well as between multiple surfaces of the joining ribs 214 and scaling channels 314. This robust seal can provide, for example, water tight seals around the electronics package 400 meeting IP67, IP 68, ISO 2281, 1 atm, or 3 atm standards.

Figure 5:
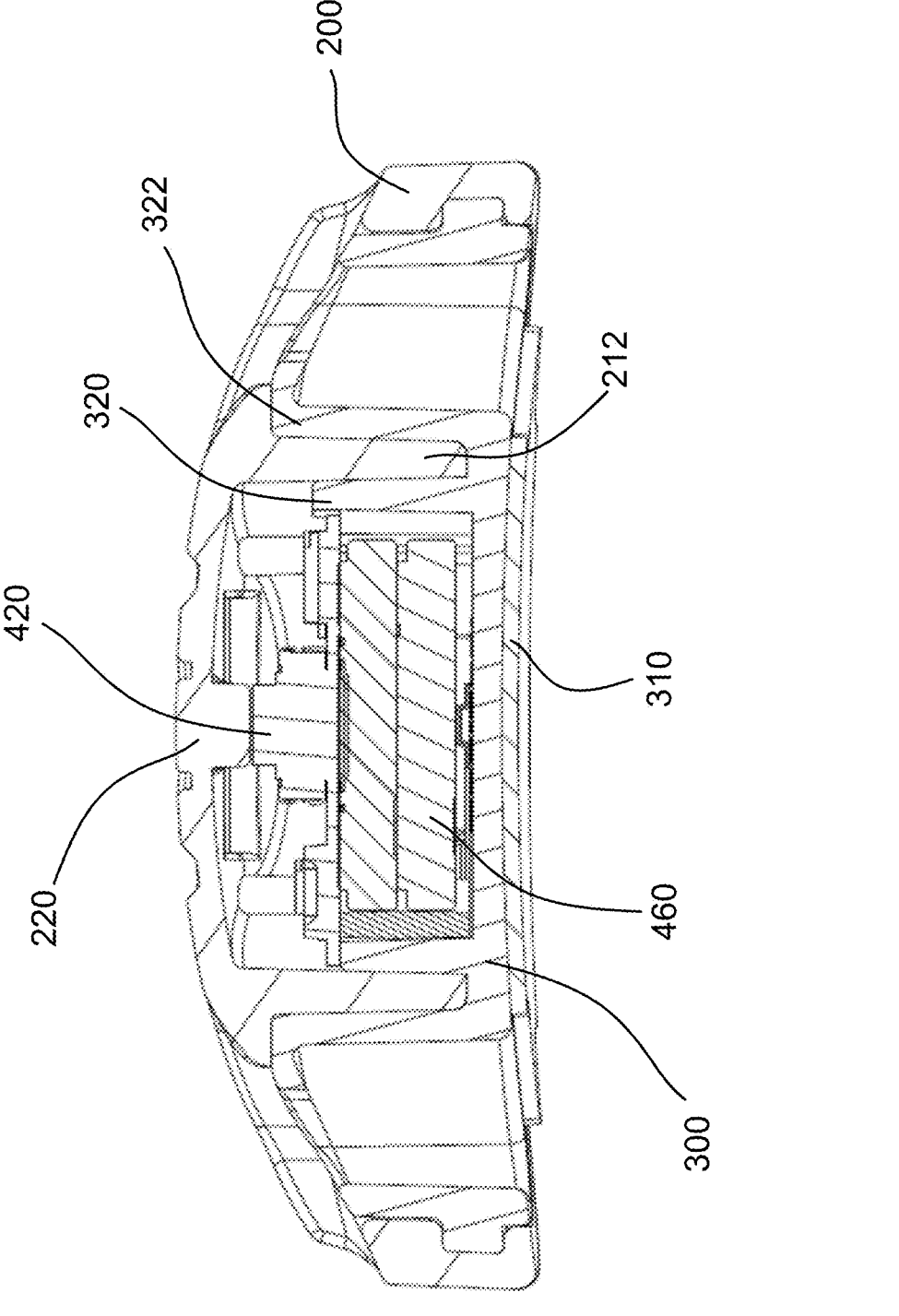
FIG. 5 is cross sectional view, including interior details, of the exemplary personal signaling device shown in FIG. 1.

FIG. 5 is cross sectional view, including interior details, of the exemplary personal signaling device shown in FIG. 1. As shown in FIG. 5, the body 200 may form the majority of the upper outer surface of the device 100, including the button area 220, and outer ends that envelop the base 300 around the attachment through holes. The joining ring 212 of the seal 210 may fit between the inner ring 320 and the outer ring 322 of the seal well. The button area 220 may include a thickened area in contact with the activation switch 420 of the EP 400. Batteries 460 may be at least partially enclosed by part of the EP 400 and the inner ring 320, which is part of the base 300. Emitted light may be emitted via LEDs on the EP 400 at least partially, or substantially, through the outer surface of the body 200. In embodiments, approximately 75%, or more, of the body's outer surface may be configured as an emitting surface. In embodiments, the body 200 may include a substantially curved emitting surface that extends around and upwards from the base 300, and/or extends substantially, or exclusively, inward of the base in plan view, e.g. as shown in FIG. 1.

As also shown in FIG. 5, the baseplate 310, or other mounting surface, may be configured to mount the device 100 on, and to at least partially conform to, a curved mounting surface. Substantially all of the emitting surface above the base may be configured to allow the emitted light to pass therethrough.

In embodiments, the activation switch 420, may be configured on a circuit board under a rigid well of the base 300, such that the switch 420 cannot be depressed when the device 100 is pushed against a flat surface of a predetermined size, e.g. the activation switch is not responsive when pushed on by an object with a surface profile that is substantially larger than a human finger, larger than a flat surface with a diameter approximately 1.0 inch or greater, contact surfaces larger than 1.0 square inch, etc. This may be achieved, for example, by modifying the diameter and/or height of the rigid well in which the EP 400 sits. As used herein, when describing force applying objects and surfaces, "contact surfaces" should be understood as those surfaces that exert a force vector with a component in the direction of switch activation when the object is pressed to the switch and/or against the device. For example, in the case of a generally cylindrical force-applying member with a rounded tip, like a human finger, the surfaces of the rounded tip would be considered to be contact surfaces as they exert a force vector with a component in the direction of switch activation when the finger is pressed against the switch in the direction of the switch actuation. On the contrary, the cylinder walls, e.g. the sides of the finger, would generally not be considered to be contact surfaces.

Figure 6:
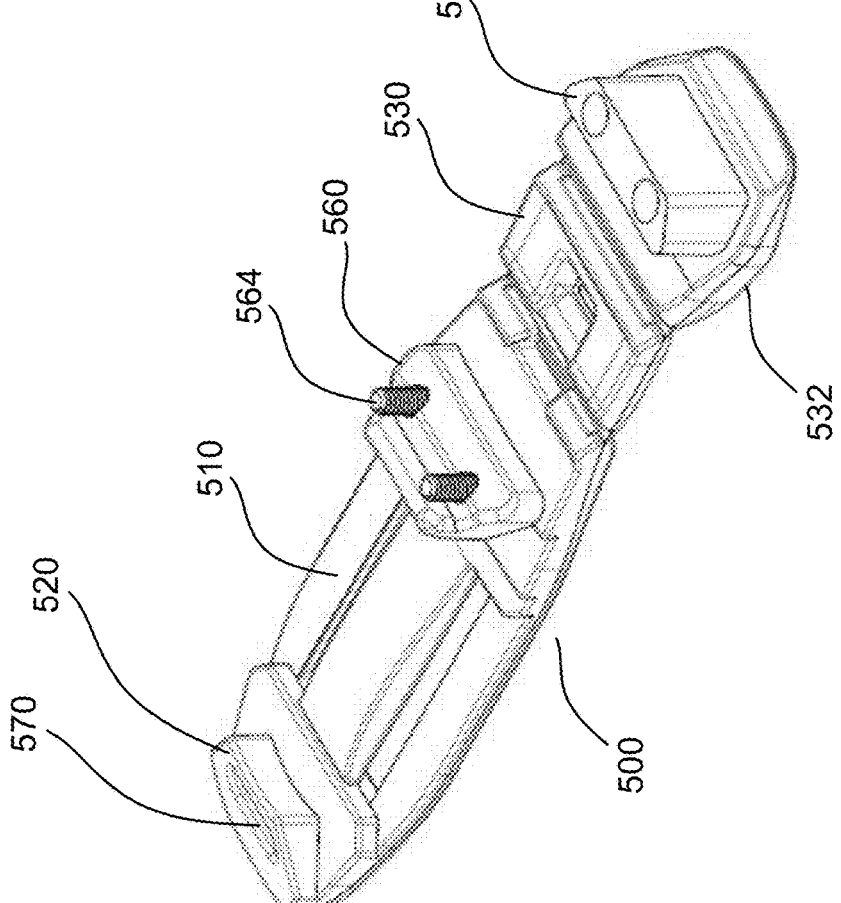
FIGS. 6-9 depict an exemplary mounting clip according to further aspects of the invention.

FIGS. 6-9 depict an exemplary clip according to further aspects of the invention. As shown in FIG. 6, mounting clip 500 includes a base 510, and tabs 530, 532. Attached to base 510 is a first attachment plug 560 and attached to tab 532 is a second attachment plug 562. The attachment plugs 560, 562 may be sized and shaped to fit within the attachment through holes of the base 300 and/or body 200. Preferably, and as may be appreciated in comparing FIGS. 3 and 4, the attachment plugs 560, 562 may be sized and shaped to fit within the attachment through holes 360 of the base 300, which may be relatively rigid, without interfering with the seal formed between the base 300 and the relatively flexible body 200.

The tabs 530, 532 include flexible hinges that allow the tabs 530, 532 to flexed with respect to each other and the base 510, as discussed further below. The clip 500 may be manufactured predominantly, or substantially, from a single materials, such as a plastic, that is relatively rigid in appropriate thicknesses, yet flexible when formed in a relatively thin dimension, such as at the hinges between the base 510 and tab 530, and between tabs 530 and 532.

As also shown in FIG. 6, attachment plug 560 may include one or more locking mechanisms 564 that are configured to join with and secure the attachment plug 560 to the attachment plug 562. This may be accomplished, for example, by using threaded bolts with a diameter that bites into wells formed in attachment plug 562, female threaded receptacles into which bolts inserted through attachment plug 562 may be screwed, etc.

Figure 8:
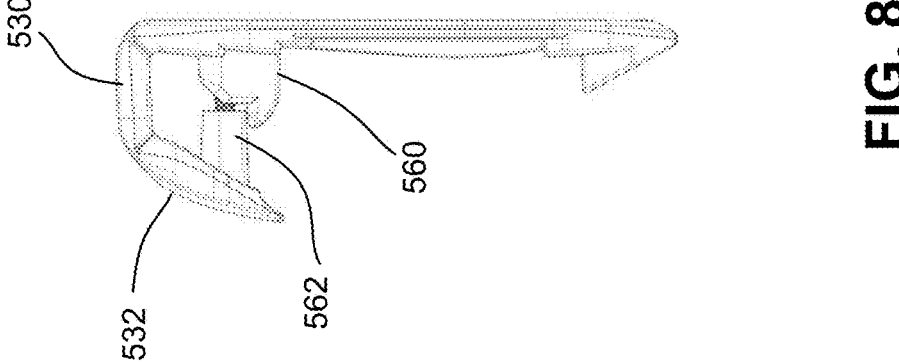
Figure 7:
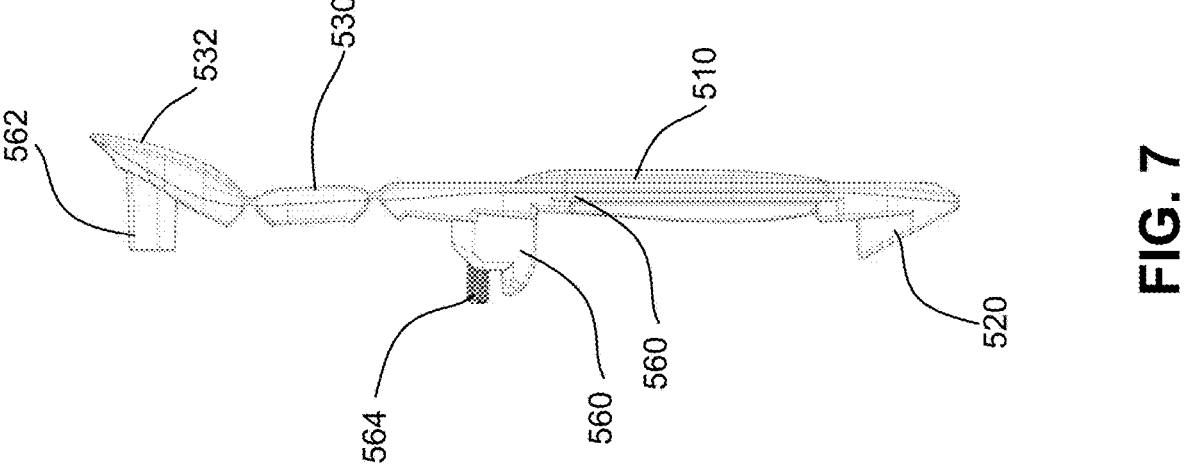

FIGS. 7 and 8 are side views of the clip 500, showing details of how the clip 500 may be folded into a secure position, used to hold the combined body 200 and base 300. Specifically, FIG. 7 shows the clip 500 in an unfolded configuration, in which the tabs 530, 532 are extended from the base 510. FIG. 8 shows the tabs 530, 532 folded toward the base 510 with the attachment plug 562 joined to the attachment plug 560, e.g. via mechanisms 564.

The clip 500 also includes at least one aperture, e.g. through hole 570, that is configured to align with the attachment through holes of the body 200 and base 300 such that the device 100 may be secured to a mounting surface when held by the clip 500. The body and/or base may include one or more clipping mechanisms, e.g. disposed on the body, and/or base, to attach the device to a mounting surface and/or further secure the joined body 200 and base 300 in the clip 500.

Figure 10:
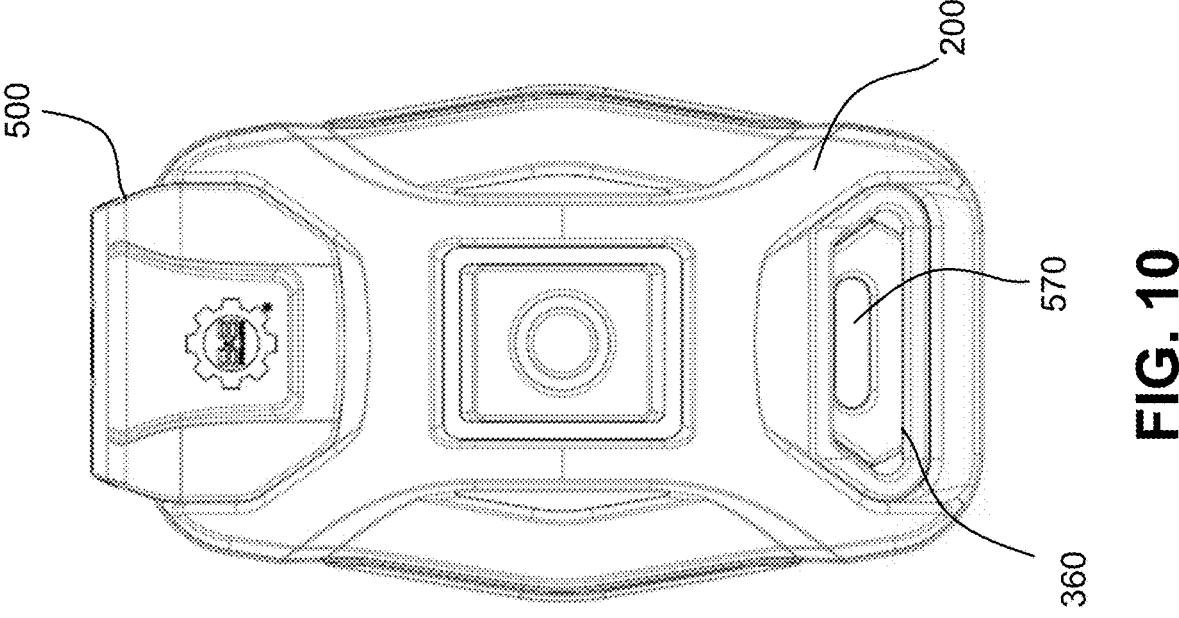
FIG. 10 depicts yet another embodiment of an exemplary personal signaling device, including the mounting clip shown in FIGS. 6-9.
Figure 9:
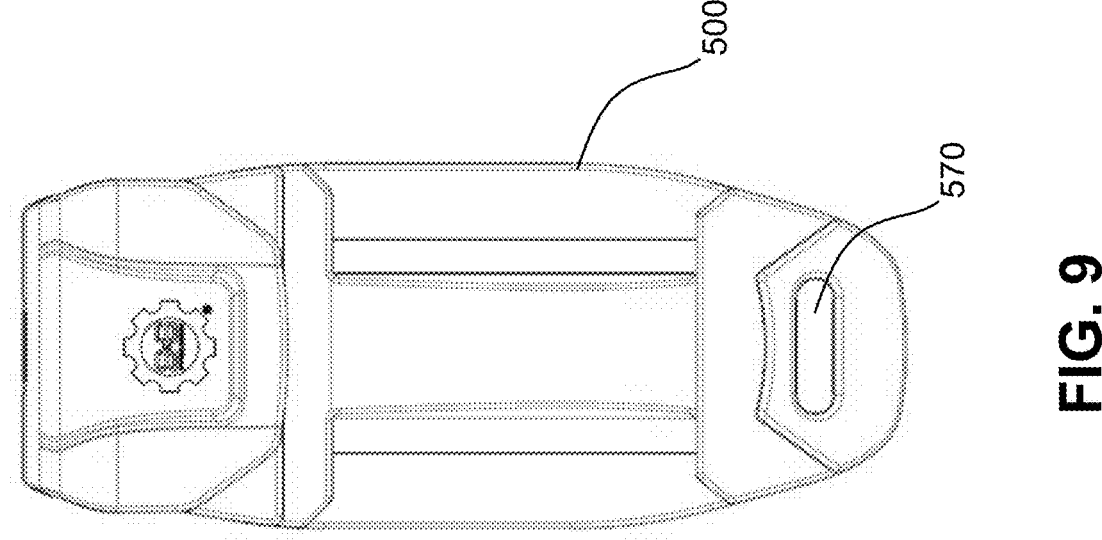

FIGS. 9 and 10 are front views of the folded clip 500, showing details of how the clip 500 may be used to hold the joined body 200 and base 300. FIG. 9 shows the clip 500 alone in the folded position, whereas FIG. 10 shows the clip 500 in the folded position with the joined body 200 and base

300. In this case, the joined body 200 and base 300 are held primarily by the joining of the attachment plug 560 to the attachment plug 562 through the attachment through hole 360 of the base. However, hook 520 of the clip 500 may also provide stability by nesting partially within the other attachment through hole 360 of the base. Also, through hole 570 of the clip is accessible through the attachment through hole 360 of the base.

When secured on the clip 500, a belt or other webbing may be run between the base of the clip and the baseplate 310 to secure the combined device 100 to wearable support structure, such as a belt, a vest, straps, a backpack, etc. This can be accomplished without releasing attachment plug 560 from attachment plug 562, e.g. by pulling the lower end of base 300 away from the clip base 510 releasing the hook 520 from the attachment through hole 360. Such features may be advantageous, for example, in enabling the device 100 to be attached quickly to a piece of gear, and to be removed quickly from the piece of gear and attached to another.

The clip 500 may, for example, comprise injection molded plastic or any other material capable of grasping the device 100 therein and providing a means and method of operative, secure attachment of the device 100 to an object, surface, or material.

The clip 500 may include one or more attachment points, such as through hole 570, for looping one or more objects therethrough such as one or more rubber bands, strings, cords, chains, keychain rings, belts, rings, and/or small webbing loop slots.

The device 100 may also be capable of being attached to any surface using one or more fasteners such as one or more hook and loop fasteners, also known by the commercial name Velcro®, or using any other attachment device or method known to those skilled in the art (preferably, although not necessarily, the attachment means/method allows repeated removal and replacement of the device 100 on wearable support structure). With a precut piece of hook or loop fasteners that may generally match the shape of the profile of the device 100 or the clip 500, the device may be operatively attached to the curved surface of a tactical ballistic helmet, parachuting helmet, or other helmet. This application is of particular importance because it indicates the flexibility of the device, therefore overcoming the challenge of providing illumination along and around a convex compound-curved surface. This attachment means and method permits the operative attachment of the device to the back of a parachutist's helmet, limiting the chance of the light becoming a snag hazard for the parachutist.

The device 100 and clip 500 design allows for easy transition of the device to and from the helmet and belts, straps, or MOLLE attachments found on most modern tactical load bearing equipment. For example, when the parachutist reaches the ground, the device 100 may be transitioned from the helmet into the slots of the MOLLE. The same device may become a marking device during ground operations.

While various embodiments have been described above, it is to be understood that the examples and embodiments described above are for illustrative purposes only and that various modifications or changes in light thereof will be suggested to persons skilled in the art, and are to be included within the spirit and purview of this application and scope of the appended claims. Therefore, the above description should not be understood as limiting the scope of the invention as defined by the claims.

What is claimed is:

1. A personal signaling device, comprising:

an electronics package including a circuit board, an emitter, and an activation switch;

a translucent body including a lens section, an extended seal including a sealing ring, and an attachment through hole; and a base including an inner well configured to at least partially enclose the electronics package, an outer well configured to at least partially surround the sealing ring, and an attachment through hole, wherein, the translucent body and the base are configured to be joined and un-joined by a user via a friction fit between the translucent body and the base, and in the joined configuration the electronics package is sealed between the translucent body and the base, wherein, the translucent body and the base are configured to seal the electronics package via a double seal at least partially between an inner surface of the sealing ring and the inner well, and an outer surface of the sealing ring and the outer well, and wherein the personal signaling device is capable of activation, deactivation, and subsequent reactivation by manipulation of the activation switch.

2. The personal signaling device of claim 1, further comprising a tactile feedback mechanism, such as a vibrating motor, electrically connected to the circuit board.

3. The personal signaling device of claim 1, wherein manipulation of activation switch activates or deactivates the one or more vibrating motors to indicate activation or deactivation of the emitter.

4. The personal signaling device of claim 1, further comprising a transceiver, such as an NF transceiver, electrically connected to the circuit board and configured to change at least one of a programming, blink pattern, emitting spectrum, or status of the personal signaling device.

5. The personal signaling device of claim 1, wherein the base is opaque and the lens section includes all of the body that is not obstructed from outward view by the base.

6. The personal signaling device of claim 1, wherein the emitter includes one or more LEDs.

7. The personal signaling device of claim 1, wherein the extended seal includes a plurality of ribs and the outer well is integrally formed with a plurality of seal channels extending outward from the inner well, and the plurality of ribs are configured to join with the plurality of seal channels.

8. The personal signaling device of claim 1, wherein the attachment through hole of the translucent body is configured to seal at least partially around the attachment through hole of the base.

9. The personal signaling device of claim 1, further comprising a battery in electrical connection to the circuit board, wherein the battery is surrounded by the inner well.

10. The personal signaling device of claim 1, further comprising a mounting clip configured to attach to the body and the base, wherein the mounting clip includes a first attachment plug and a second attachment plug, the first attachment plug and the second attachment plug being connected by a flexible tab, and the first attachment plug and the second attachment plug configured to connect to one another through the attachment through hole of the translucent body and the attachment through hole of the base.

* * * * *